(12) United States Patent
Yang et al.

(10) Patent No.: US 8,377,730 B2
(45) Date of Patent: Feb. 19, 2013

(54) METHOD OF MANUFACTURING VERTICALLY ALIGNED NANOTUBES, METHOD OF MANUFACTURING SENSOR STRUCTURE, AND SENSOR ELEMENT MANUFACTURED THEREBY

(75) Inventors: Seung Yun Yang, Nam-gu (KR); Gumhye Jeon, Changwon-si (KR); Hyungjun Kim, Pohang-si (KR); Jong Yeog Son, Pohang-si (KR); Chang-Soo Lee, Pohang-si (KR); Jin Kon Kim, Pohang-si (KR); Jinseok Byun, Yuseong-gu (KR)

(73) Assignee: Postech Academy-Industry Foundation, Pohang (KR)

( * ) Notice: Subject to any disclaimer, the term of this patent is extended or adjusted under 35 U.S.C. 154(b) by 324 days.

(21) Appl. No.: 12/647,777

(22) Filed: Dec. 28, 2009

(65) Prior Publication Data

US 2011/0012103 A1    Jan. 20, 2011

(30) Foreign Application Priority Data

Jul. 17, 2009   (KR) .................. 10-2009-0065446

(51) Int. Cl.
*H01L 21/3205* (2006.01)
*H01L 21/461* (2006.01)

(52) U.S. Cl. .......... 438/49; 977/734; 977/810; 977/893; 977/902; 257/E21.461; 257/E21.486; 257/43

(58) Field of Classification Search ............... 438/49; 257/43, E21.461, E21.486, E29.1
See application file for complete search history.

(56) References Cited

U.S. PATENT DOCUMENTS

| | | | |
|---|---|---|---|
| 2006/0292345 A1* | 12/2006 | Dave et al. ............. | 428/141 |
| 2008/0224717 A1* | 9/2008 | Kim et al. ............... | 324/691 |
| 2009/0130380 A1* | 5/2009 | Asakawa et al. ........ | 428/116 |
| 2009/0243584 A1* | 10/2009 | Zhang et al. ............ | 324/71.1 |
| 2010/0129623 A1* | 5/2010 | Johansson et al. ...... | 428/206 |

\* cited by examiner

*Primary Examiner* — Mamadou Diallo
(74) *Attorney, Agent, or Firm* — Sherr & Jiang, PLLC

(57) ABSTRACT

Provided is a method of manufacturing a sensor structure, where vertically-well-aligned nanotubes are formed and the sensor structure having an excellent performance can be manufactured at the room temperature at low cost by using the nanotubes. The method of manufacturing a sensor structure includes: (a) forming a lower electrode on a substrate; (b) forming an organic template having a pore structure on the lower electrode; (c) forming a metal oxide thin film in the organic template; (d) forming a metal oxide nanotube structure, in which nanotubes are vertically aligned and upper portions thereof are connected to each other, by removing the organic template through a dry etching method; and (e) forming an upper electrode on the upper portions of the nanotubes.

18 Claims, 8 Drawing Sheets

FIG. 1A
*-Prior Art-*
REACTION IN AIR $O_2$ (gas) $\leftrightarrow$ $O_2$ (absorbed)

$O_2$ (absorbed) + $e^-$ $\leftrightarrow$ $O_2^-$     at T $\leq$ 500 K $O_2^-$ + $e^-$ $\leftrightarrow$ $2O^-$    at T $\geq$ 500 K

FIG. 1B
*-Prior Art-*
REACTION IN MIXTURE OF ETHANOL AND AIR $CH_3CH_2OH_{ads} + 6O^-$ $\rightarrow 2CO_2 + 3H_2O + 6e^-$

METHOD OF MANUFACTURING VERTICALLY ALIGNED NANOTUBES, METHOD OF MANUFACTURING SENSOR STRUCTURE, AND SENSOR ELEMENT MANUFACTURED THEREBY

CROSS REFERENCE TO PRIOR APPLICATIONS

This application claims priority to Korean Patent Application No. 10-2009-0065446 (filed on Jul. 17, 2009) which is hereby incorporated by reference in its entirety.

BACKGROUND OF THE INVENTION

1. Field of the Invention

The present invention relates to a method of manufacturing well-aligned nanotubes and a method of manufacturing a sensor structure using the nanotubes, and more particularly, to a method of manufacturing uniform and vertically-aligned nanotubes by using an organic template, a method of manufacturing a sensor structure having an excellent detection performance at a low cost at the room temperature by simply forming electrodes on upper and lower portions of the nanotubes, and a sensor manufactured by the method.

2. Description of the Related Art

Solid state gas sensors have been widely used to monitor environments or to control chemical engineering processes. Among various solid state sensors, much research has been made to a sensor using a semiconductor metal oxide due to small size, low production cost, and simple manufacturing processes thereof.

Figure 1A:
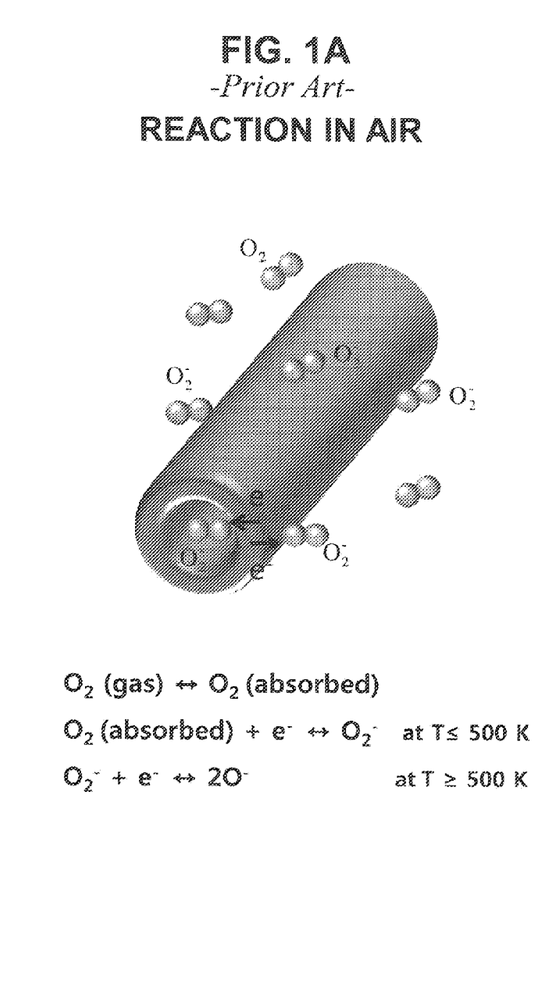
Figure 1B:
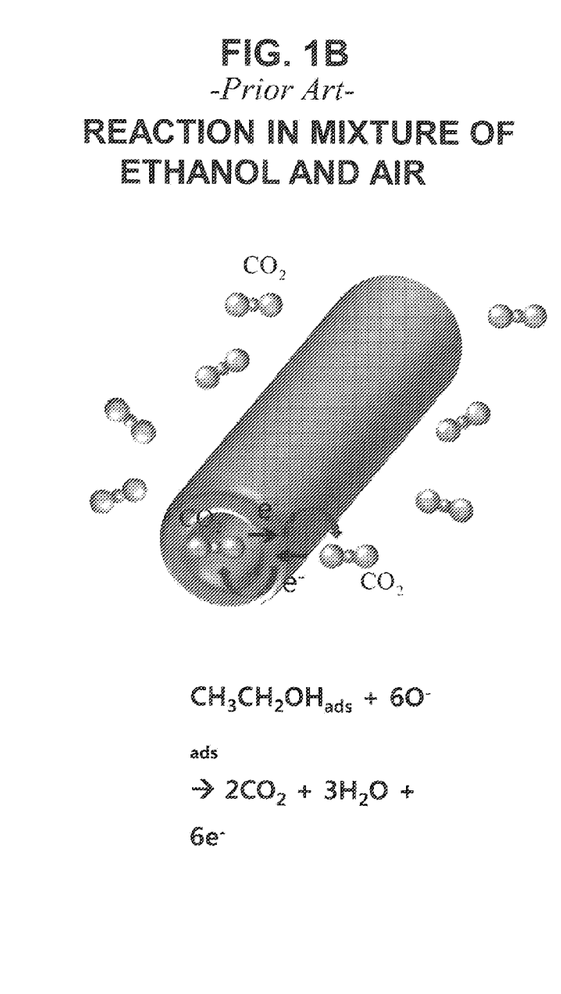

FIGS. 1A and 1B are schematic views showing a principle of operation of a gas sensor using a semiconductor metal oxide. As shown in FIG. 1A, when the metal oxide is exposed to air, oxygen gas is adsorbed to a surface of the metal oxide. The adsorbed oxygen is reduced with electrons received from the metal oxide. In the process, a density of electrons on the surface of the metal oxide is lowered, so that resistance is increased. On the other hand, as shown in FIG. 1B, when a reducing gas such as ethanol is introduced, the electrons that are coupled with the adsorbed oxygen molecules are transferred to the metal oxide due to the reaction between the absorbed oxygen molecules and the ethanol molecules. Accordingly, the conductivity of the surface of the metal oxide is increased, and the resistance is decreased.

During the electron exchange process according to the gas introduction, the change in the resistance of the metal oxide is measured, so that the gas can be detected. This is the principle of operation of the sensor using the metal oxide.

On the other hand, in the manufacturing of the gas sensor using the metal oxide, the metal oxide has been formed as a thin film to be used for the gas sensor. However, since the metal oxide has a small surface area per unit volume, the sensitivity of the sensor is not high.

Therefore, much attention has been paid to one-dimensional nano structures, which have a large surface area per unit volume. Accordingly, various nano structures such as nano particles, nano wires, nano bars, and nanotubes have been used for the sensors. Among the nano structures, nanotube structures being vertically aligned with small wall thickness and large surface area are considered to be the best structure.

On the other hand, various methods such as a hydrothermal method, a chemical vapor deposition method, an electrochemistry method, and a template method have been known as a method of manufacturing the nanotube structure. Among the methods, the template method has been widely used due to its advantage capable of easily manufacturing uniform nanotube structure. In the template method, a template having a predetermined shape is formed, and the template is filled with a material, so that a desired structure can be obtained. An AAO (anodic aluminum oxide) and a track-etched membrane are mainly used as the template.

Figure 3A:
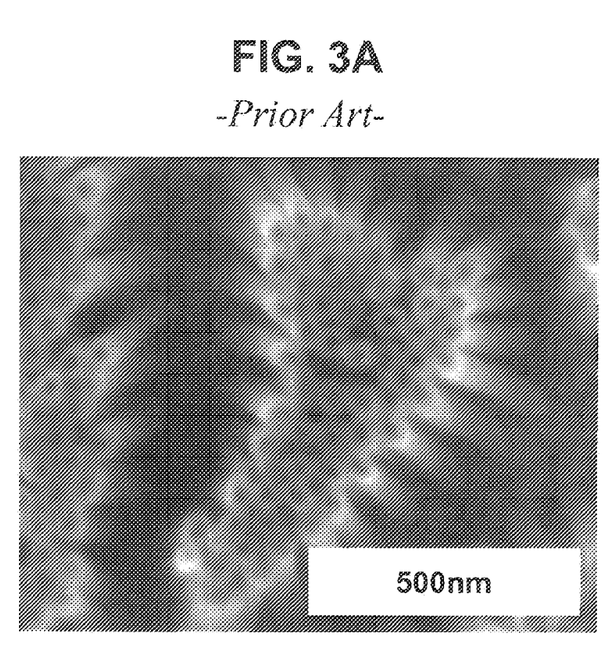
FIG. 3A is a view showing an image of nanotubes manufactured by using a wet removing method in the related art.

In the process of manufacturing the nanotubes by using the AAO or track-etched membrane template, a wet etching method is used to remove the template. At this time, as shown in FIG. 3A, there is a problem in that the nanotube structure is collapsed or agglomerated. Therefore, the performance of the sensor deteriorates.

SUMMARY OF THE INVENTION

The invention is to provide a method of manufacturing a sensor structure, which can be manufactured at low production cost with simple processes and has a sensitivity of 10 or more at a concentration of 5 ppm or less at the room temperature, particularly, excellent performance at the room temperature.

The invention is also to provide a method of manufacturing a nanotube array structure, in which nanotubes are vertically-well-aligned on a substrate at a high density of integration.

According to an aspect of the invention, there is provided to a method of manufacturing a sensor structure, comprising: (a) forming a lower electrode on a substrate; (b) forming an organic template having a pore structure on the lower electrode; (c) forming a metal oxide thin film in the organic template; (d) forming a metal oxide nanotube structure, in which nanotubes are vertically aligned and upper portions thereof are connected to each other, by removing the organic template through a dry etching method; and (e) forming an upper electrode on the upper portions of the nanotubes.

In the related art, it is very difficult to form well-aligned free-standing nanotubes on a substrate, and if a wall thickness of each nanotube is small, the nanotubes can be easily damaged.

However, in the method according to the invention, the organic template, which has a good workability and can be easily removed, is used. The metal oxide thin film is formed in the organic template, so that the nanotube structure is formed. Next, the organic template is removed by a thermal decomposition method, so that destruction of the nanotube structure can be prevented unlike the case using a wet etching method. Therefore, the nanotube structure, in which nanotubes are vertically-well-aligned and upper portions thereof are connected to each other, can be easily obtained.

According to the invention, since the upper portions of the nanotubes are connected to each other, the upper electrode for a gas sensor can be easily formed. In addition, since the upper portions of the nanotubes have a function of sustaining the aligned state of the nanotubes, it is possible to obtain a nanotube array structure constructed with very thin nanotubes having a wall thickness of about 10 nm without defects. Therefore, in the method according to the invention, a ultra-high density array of nanotubes can be implemented, so that it is possible to greatly improve a performance of the gas sensor.

In addition, in the nanotube structure, contact area with respect to an electrode that is to be formed on the upper portions of the nanotubes can be increased, so that reliability of a sensor structure using the nanotube structure can be improved.

According to another aspect of the invention, there is provided to a method of manufacturing a sensor structure, comprising: (a) forming an organic template having a pore structure on a substrate that can be used as an electrode; (b) forming a metal oxide thin film in the organic template; (c) forming a metal oxide nanotube structure, in which nanotubes are vertically aligned and upper portions thereof are connected to each other, by removing the organic template through a dry etching method; and (d) forming an upper electrode on the upper portions of the nanotubes.

In the embodiment, various substrates made of silicon, a glass, a metal, or a polymer may be used. In the case where the substrate is made of a material such as ITO or metal that can be utilized as an electrode, a process of forming a lower electrode layer can be omitted, so that the manufacturing process can be simplified.

In addition, in the above aspect, forming an organic template may comprise: forming a polymer film on the substrate; forming an AAO mask having a pore structure on the polymer film; transferring the pore structure of the AAO mask to the polymer film through an etching process; and removing the AAO mask.

The pore structure can be easily adjusted by the AAO mask, and the AAO mask has a strong mechanical strength. Therefore, in the case where the polymer template is formed by using the AAO mask, the polymer template having well-adjusted pore structure can be manufactured. By using the polymer template, the vertically-well-aligned nanotube array structure can be formed to have a large area.

In addition, the organic template may be formed by using any organic material, by which a pore structure can be easily formed. As a preferred example of the organic material, polyimide may be used, because the pore structure can be easily adjusted.

In addition, the metal oxide thin film may be formed by an ALD method. In addition, the metal oxide thin film may also be formed by various synthesizing method such as a CVD method, a sol-gel method, and an electropolymerization method.

In addition, the polymer film may be formed by a well-known polymer film forming method such as a spin coating method, a dip coating method, a bar coating method, or a solvent casting method.

In addition, the etching of the polymer film may be performed by an $O_2$ RIE (reactive ion etching) method.

According to another aspect of the invention, there is provided to a method of manufacturing nanotubes which are vertically aligned and of which upper portions are connected to each other, comprising: (a) forming a polymer film on a substrate; (b) forming an AAO mask having a pore structure on the polymer film; (c) transferring the pore structure of the AAO mask to the polymer film through an etching process; (d) forming a polymer template by removing the AAO mask; (e) forming a thin film in the polymer template; and (f) removing the polymer template by a dry etching method.

According to another aspect of the invention, there is provided to a method of manufacturing nanotubes which are vertically aligned and of which upper portions are separated from each other, comprising: (a) forming a polymer film on a substrate; (b) forming an AAO mask having a pore structure on the polymer film; (c) transferring the pore structure of the AAO mask to the polymer film through an etching process; (d) forming a polymer template by removing the AAO mask; (e) forming a thin film in the polymer template; and (f) removing the thin film formed in an upper portion of the polymer template and removing the polymer template by a dry etching method.

According to the method of manufacturing a sensor structure, the following effects can be obtained.

Firstly, after a substrate that can be utilized as an electrode is formed or after a lower electrode is formed on the substrate, vertically aligned nanotube structure is formed, and the electrode is formed on the upper portion thereof, so that the sensor structure can be manufactured by a simple method. Accordingly, a solid state gas sensor can be manufactured at low cost.

Secondly, the organic template, in which the pore structure is well adjusted, can be formed by using the AAO mask. The organic template can be removed by a dry etching method. Therefore, in comparison with the dry etching method, uniform and vertically-well-aligned nanotubes can be obtained, and the gas sensor having excellent performance can be manufactured.

Thirdly, after the organic template is removed by using a thermal decomposition method, the nanotube structure, in which upper portions of the vertically-aligned nanotubes are connected to each other, can be obtained. Accordingly, contact area with respect to an upper electrode can be increased, so that reliability of the sensor structure such as adhesion to the electrode can be improved.

Figure 3B:
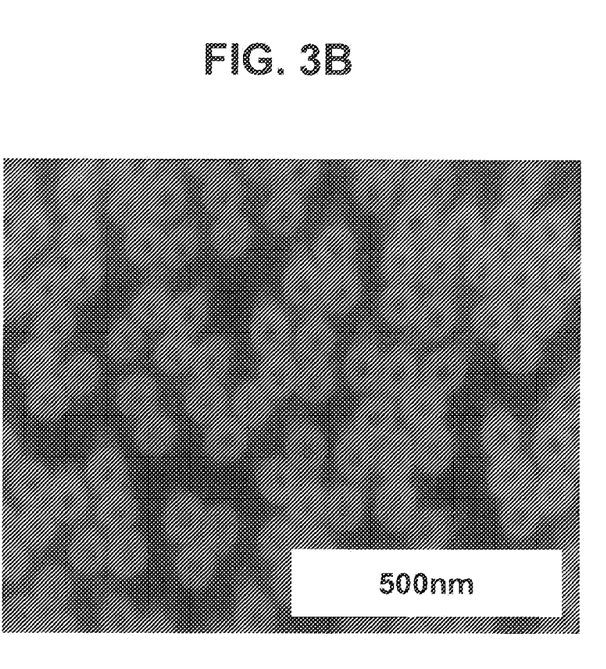
FIG. 3B is a view showing an image of nanotubes manufactured according to an embodiment of the invention.

In addition, unlike the case where an inorganic template such as an AAO template or a track-etched membrane is used, in another method of manufacturing nanotube structure according to the invention, the nanotube structure is directly formed by the organic template having good adhesion to the substrate, so that the uniform nanotubes can be formed without defects in a large area. In addition, since the template is removed by using a dry etching method rather than a wet etching method, as shown in FIG. 3B, the nanotubes are not agglomerated after the template is removed. Accordingly, the nanotube structure without destruction in structure can be manufactured.

BRIEF DESCRIPTION OF THE DRAWINGS

The above and other features and advantages of the present invention will become more apparent by describing in detail exemplary embodiments thereof with reference to the attached drawings in which:

FIGS. 1A and 2B are diagrammatic views showing a principle of gas detection of a sensor using a metal oxide.

FIGS. 2A to 2D are diagrammatic views showing processes of manufacturing nanotubes according to an embodiment of the invention.

DETAILED DESCRIPTION OF THE INVENTION

Hereinafter, an organic template, a method of manufacturing nanotubes using the organic template, and a method of manufacturing a sensor structure using the organic template according to embodiments of the invention will be described in detail with reference to the accompanying drawings. However, the invention is not limited to the embodiments described below. Therefore, it can be understood by the ordinarily skilled in the related art that various modifications are available within the scope of the invention without departing from the spirit of the invention.

First Embodiment

A method of manufacturing nanotubes using an organic template according to a first embodiment of the invention mainly includes four processes: 1) a process of forming a polymer film and an AAO (anodic aluminum oxide) mask; 2) a process of forming an organic template through a plasma etching method; 3) a process of forming nanotubes through an ALD method; and 4) a process of removing the organic template.

The polymer film can be formed by using various well-known organic materials through well-known film forming methods. In the embodiment, a polyimide film (hereinafter, referred to as a "PI film") that is formed by spin-coating an amic acid and, after that, performing thermal treatment is used. More specifically, according to the method of forming the PI film, an 11 wt % amic acid dissolved in an NMP solution is spin-coated on an ITO glass substrate at 3,000 rpm, so that a film having a thickness of about 1,000 nm is formed. Next, the resulting film is thermally treated for 1 hour at 150° C., for 1 hour at 200° C., and for 1 hour at 300° C., and after that, natural drying is performed, so that the PI film is obtained. During the thermal treatment, the thickness is reduced by about 60%. Finally, the PI film has a thickness of 600 nm.

Next, an AAO mask is formed on the PI film. More specifically, a surface of an aluminum (Al) sheet having a size of 3 cm×4 cm is polished to be flat through an electropolishing method, in which a voltage of 20 V is applied to the Al sheet in a solution having a perchloric acid:ethannol=1:4 at 7° C. Next, a voltage of 40V is applied to the polished Al sheet in an oxalic acid solution at 15° C. for 9 hours, so that the first anodic oxidation process is performed. As a result, an AAO layer having nano pores that are aligned in a hexagonal structure due to self-assembly can be formed. Since the uniformity of pores in the first anodic oxidation process is not high, an oxide structure is removed by using a chromic acid, and after that, a second anodic oxidation process is performed under the same conditions as the first anodic oxidation process. A depth of the pore is determined according to an oxidation time. The oxidation is performed for about six minutes, so that nano pores having a depth of 600 nm is formed. At this time, a diameter of the pore can be adjusted to be in a range of 25 nm to 90 nm by an additional phosphoric acid solution treatment. In the embodiment of the invention, the phosphoric acid solution treatment is performed for 27 minutes, so that an AAO having nano pores having a diameter of 50 nm is formed. If a voltage of about 55V is applied to the AAO in an electropolishing solution, the aluminum layer and the aluminum oxide layer are separated. Next, impurities are removed by using an ethanol solution, and the AAO layer is mounted on a PI film. At this time, since the boundary surface may not clearly be separated, the AAO mask is mounted on the PI film in a face-down manner.

Figure 4:
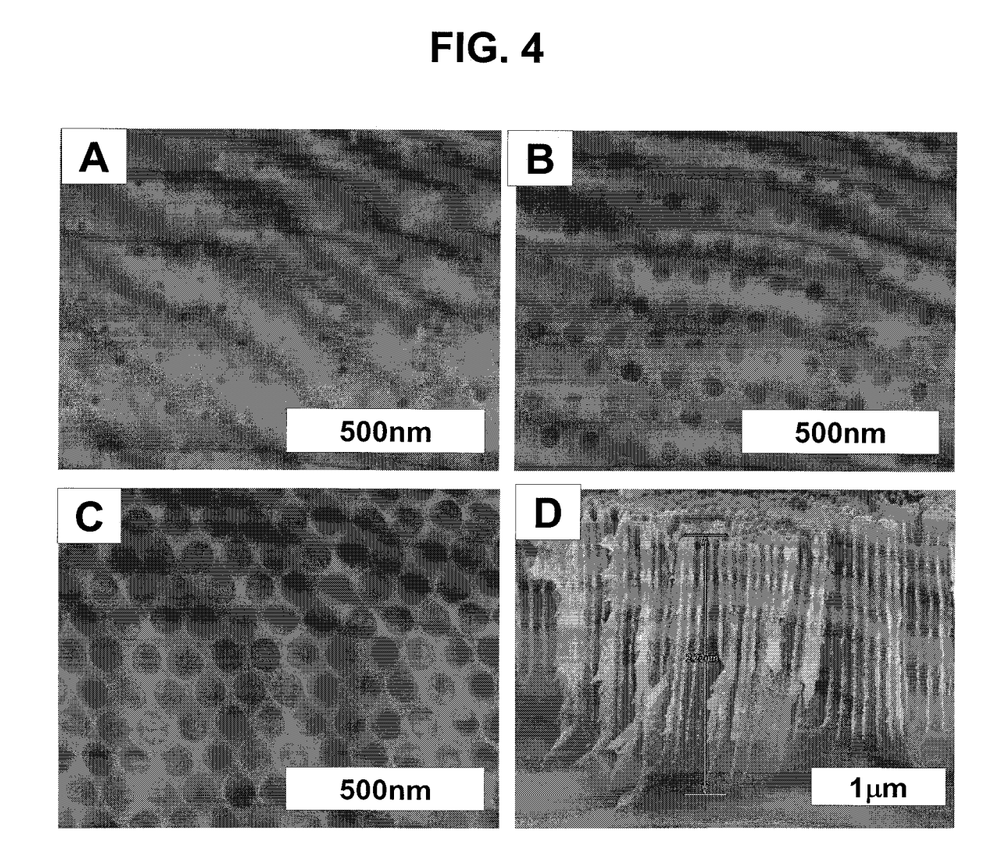
FIG. 4A is a view showing an image of an organic template, of which size of pore is adjusted to 20 nm by etching.
FIG. 4B is a view showing an image of an organic template, of which size of pore is adjusted to 45 nm by etching.
FIG. 4C is a view showing an image of an organic template, of which size of pore is adjusted to 80 nm by etching.
FIG. 4D is a view showing an image of the side surface of FIG. 4C.

Next, in order to perform a polymer etching process, a surface of the AAO mask is firstly etched through an RIE etching method using $CF_4$ gas. Next, an RIE process using $O_2$ gas is performed. According to etching time and power in the RIE process, a size of the pore can be adjusted to be in a range of 20 nm to 80 nm, and a depth thereof can also be adjusted to be 2,000 nm or more (refer to FIG. 4). For the convenience, a PI template having pores having a size of 70 nm and a length of 600 nm is used for a gas sensor. In this case, the $O_2$ plasma condition is as follows. The gas pressure is 10 mTorr; the gas flow rate is 5 ccm; and the chuck bias is 120 W. In this condition, the etching process is performed for 20 minutes, so that the PI template is formed.

Figure 2:
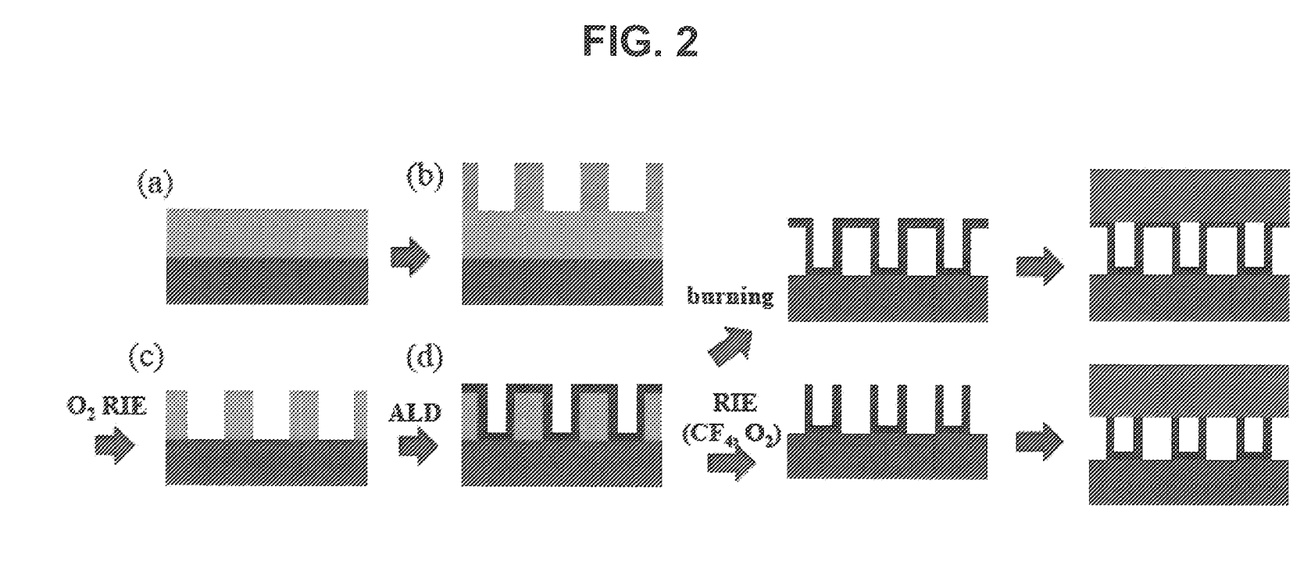

After the pore structure of the AAO mask is transferred, the AAO mask is removed by using a tape, so that an organic template is obtained as shown in FIG. 2C. Although the AAO mask is removed by the tape in the embodiment of the invention, the AAO mask may be removed by well-known methods using an alkali solution or an acid solution.

Next, in order to form nanotubes, a ZnO film is firstly formed on the PI template by using an ALD method. As a precursor for the ZnO ALD process, DEZ (diethyl Zinc) and $H_2O$ are used. The precursor is injected for 0.5 seconds, exposed for 3 seconds, and purged for 3 seconds. These processes are alternately performed, so that a ZnO layer having a thickness of 10 nm is formed. At this time, the deposition temperature is set to 150° C.

Figure 5:
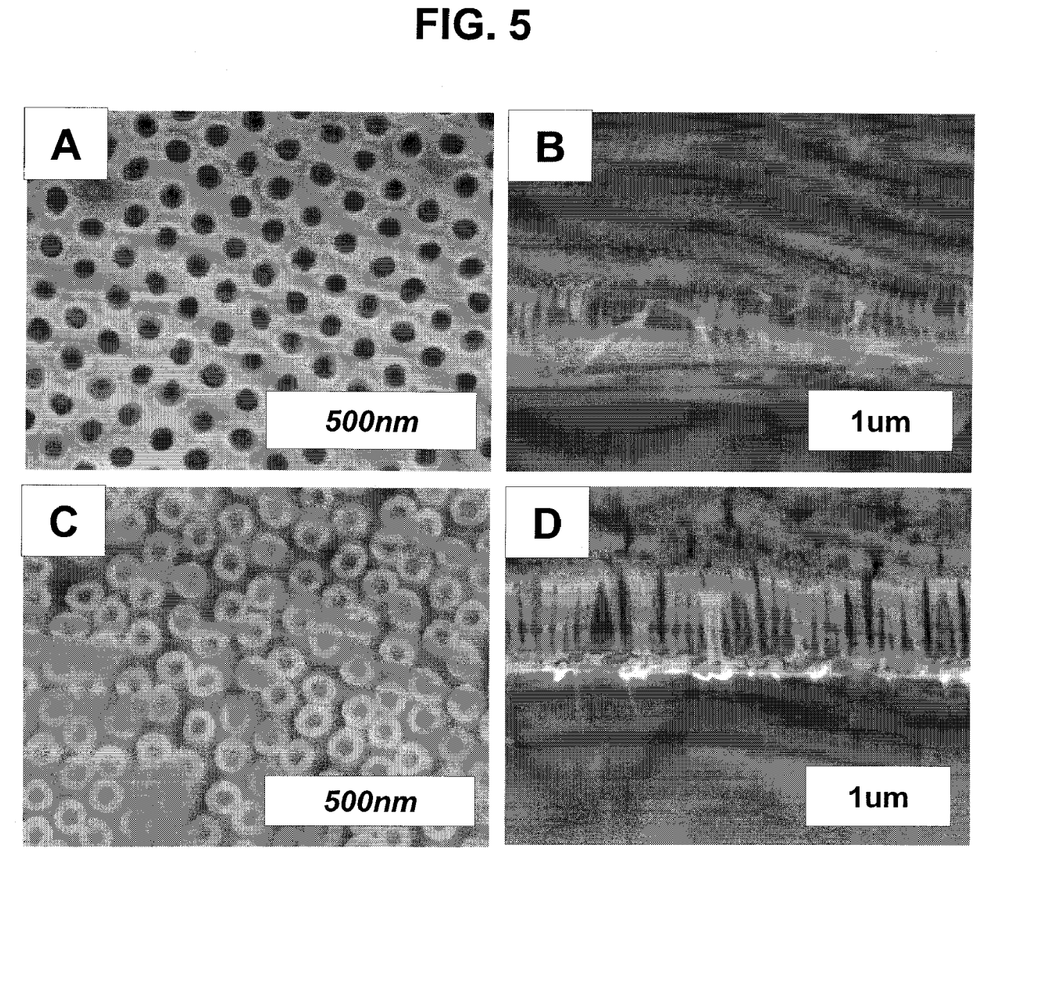
FIG. 5A is a view showing a plan image of a ZnO nanotube array structure manufactured according to a first embodiment of the invention, where upper portions are connected to each other.
FIG. 5B is a view showing a side image of the ZnO nanotube array structure manufactured according to the first embodiment of the invention, where the upper portions are connected to each other.
FIG. 5C is a view showing a plan image of a ZnO nanotube array structure manufactured according to the first embodiment of the invention, where upper portions are separated from each other.
FIG. 5D is a view showing a side image of the ZnO nanotube array structure manufactured according to the first embodiment of the invention, where the upper portions are separated from each other.

Finally, in order to remove the PI template, while $O_2$ gas is allowed to flow at a flow rate of 10 ccm, thermal treatment is performed at 600° C. for 3 hours. As a result, the PI template is completely removed. Next, an etching process is performed for 5 minutes by using a $CF_4$ plasma (gas flow 5 ccm, gas pressure 10 mTorr, source power 20 W, chuck power 50 W), so that a thin layer formed on the nanotubes are removed. Next, the PI template is removed by using an $o_2$ plasma (gas flow 5 ccm, gas pressure 5 mTorr, source power 100 W, chuck power 100 W), so that the nanotubes, which are individually erected due to separated upper portions thereof, can be obtained (refer to FIGS. 5C and 5D). A nanotube array structure having connected upper portions, which is obtained by removing only the organic template through thermal treatment, is used for a gas sensor (refer to FIGS. 5A and 5B).

Next, in order to manufacture the gas sensor by using the ZnO nanotube structure, an Au thin film is deposited on an ITO glass, on which the ZnO nanotubes are aligned, by using a disk-like mask having a diameter of 1 mm. A thermal deposition method is used for the deposition of the Au thin film. After the Au thin film having a thickness of about 100 nm is deposited at $10^{-5}$ Torr, thermal treatment is performed at 400° C. for 30 minutes. As a result, a gas sensor having a structure of a lower ITO electrode, ZnO nanotubes, and an upper Au electrode is manufactured.

Second Embodiment

In a second embodiment of the invention, a gas sensor having $TiO_2$ nanotubes is manufactured. The processes of manufacturing the organic template and forming the Au thin film are the same as those in the first embodiment. The $TiO_2$ nanotubes are formed as follows.

In order to form the nanotubes, an $TiO_2$ thin film is formed on the PI template, which is formed to be the same as that of the first embodiment, by using an ALD method. As a precursor for the $TiO_2$ ALD process, TTIP and $H_2O$ are used. The precursor is injected for 0.5 seconds, exposed for 3 seconds, and purged for 3 seconds. These processes are alternately performed, so that a $TiO_2$ layer having a thickness of 10 nm is formed. At this time, the deposition temperature is set to 250° C. As a result, an anatase phase is formed.

Although the ZnO and the $TiO_2$ are described in the embodiments of the invention, various materials such as $HfO_2$ and $WO_3$ available for the ALD process can be adapted. In addition, various synthesizing methods such as a CVD method, a sol-gel method, and an electropolymerization method can be adapted.

Finally, in order to remove the PI template, while $O_2$ gas is allowed to flow at a flow rate of 10 ccm, thermal treatment is performed at 600° C. for 3 hours. As a result, the PI template is completely removed. Next, an etching process is performed for 5 minutes by using a $CF_4$ plasma (gas flow 5 ccm, gas pressure 10 mTorr, source power 20 W, chuck power 50 W), so that a thin layer formed on the nanotubes are removed. Next, the PI template is removed by using an $o_2$ plasma (gas flow 5 ccm, gas pressure 5 mTorr, source power 100 W, chuck power 100 W), so that the nanotubes, which are individually erected due to separated upper portions thereof, can be obtained. Similarly to the first embodiment, an Au thin film is formed over the nanotubes, so that a gas sensor is manufactured.

In order to test a gas sensitivity of the gas sensors according to the first and second embodiments, an experiment where the gas sensors (ethanol sensors) detect ethanol in a mixture of ethanol and air is performed. The sensitivity of the ethanol sensor is measured while the mixture of ethanol and air is allowed to flow into a chamber at a flow rate of 2 liters per minute.

The sensitivity of the gas (ethanol) sensor is defined as a ratio of resistance of sensor at the gas (ethanol) concentration of 0 to resistance of sensor at the measured gas (ethanol) concentration. Therefore, if the sensitivity is 2, the resistance of the sensor is increased twice due to the measured ethanol concentration. The resistance is measured while the ethanol concentration is changed from 5 ppm to 500 ppm. The sensitivity of the ethanol sensor is calculated by the following formula.

(Sensitivity)=(Resistance of sensor when only air is flown)/(Resistance of sensor when a mixture of ethanol and air is flown)

Figure 6A:
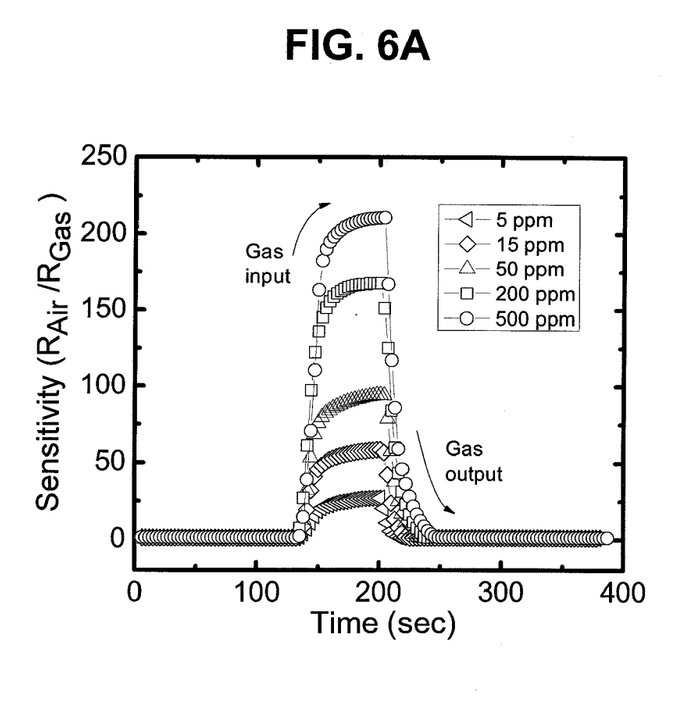
FIG. 6A is a view showing a graph of a result of measurement of a sensitivity of an ethanol gas sensor using ZnO nanotubes manufactured according to the first embodiment of the invention, of which length is 600 nm.
Figure 6B:
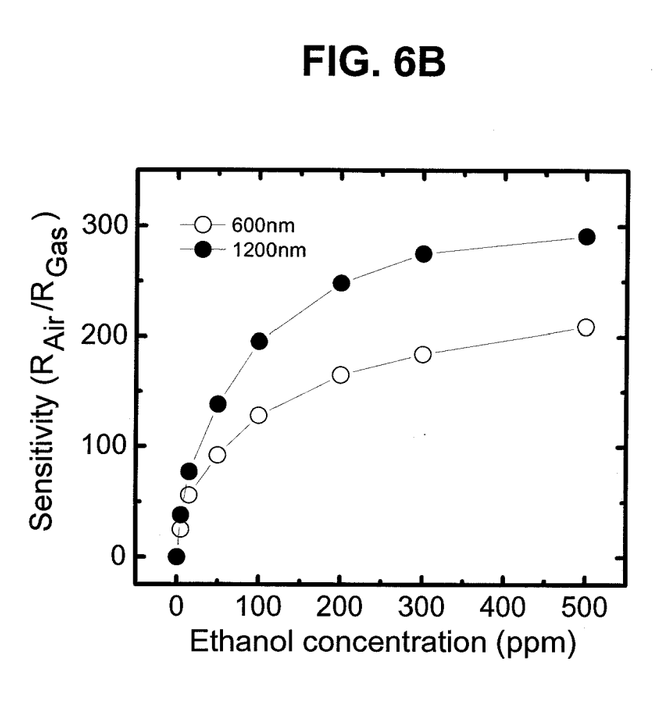
FIG. 6B is a view showing a graph of a result of measurement of a sensitivity of an ethanol gas sensor using ZnO nanotubes manufactured according to the first embodiment of the invention, of which length is 1200 nm.
Figure 6C:
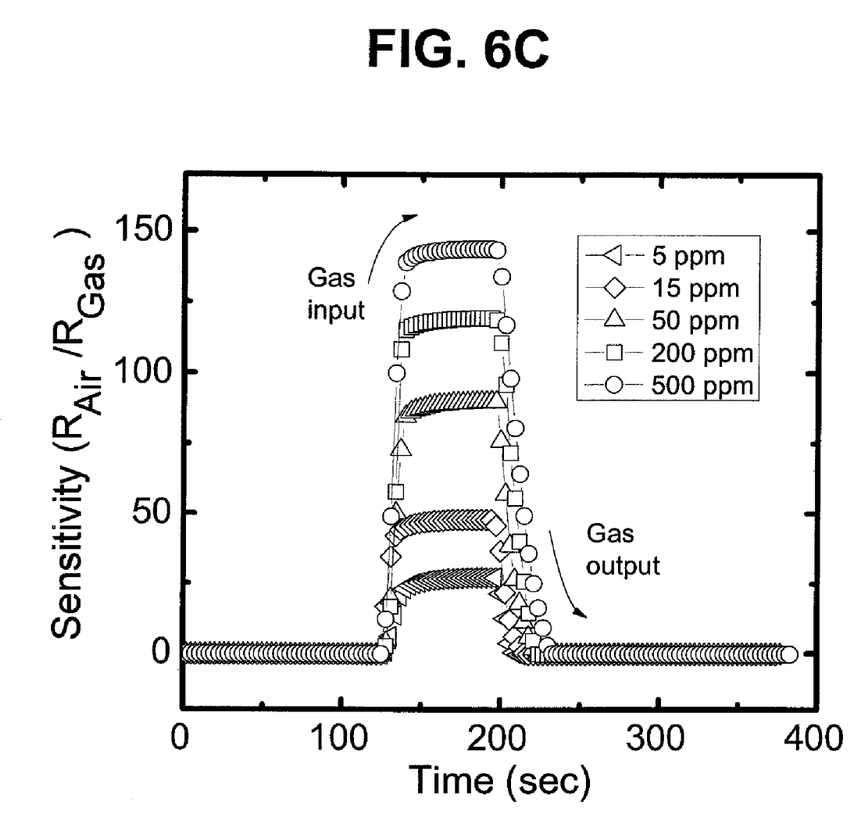
FIG. 6C is a view showing a graph of a result of measurement of a sensitivity of a hydrogen gas sensor using the ZnO nanotubes manufactured according to the first embodiment of the invention, of which length is 600 nm.

As a result, as shown in FIG. 6A, the sensitivity of the gas sensor manufactured according to the first embodiment of the invention is 25 at the room temperature at the ethanol concentration of 5 ppm. The sensitivity is increased up to 210 as the ethanol concentration is increased (refer to FIG. 6A). The sensitivity is improved by 50% or more as the length of the nanotubes is increased from 600 nm to 1,200 nm (refer to FIG. 6B). In addition, in case of the experiment for a hydrogen gas, as shown in FIG. 6C, the reaction time and recovery time of 10 seconds or less are shorter than the case of the ethanol, and the sensitivity is 27 at a low hydrogen concentration of 5 ppm, which is a high sensitivity.

Figure 7A:
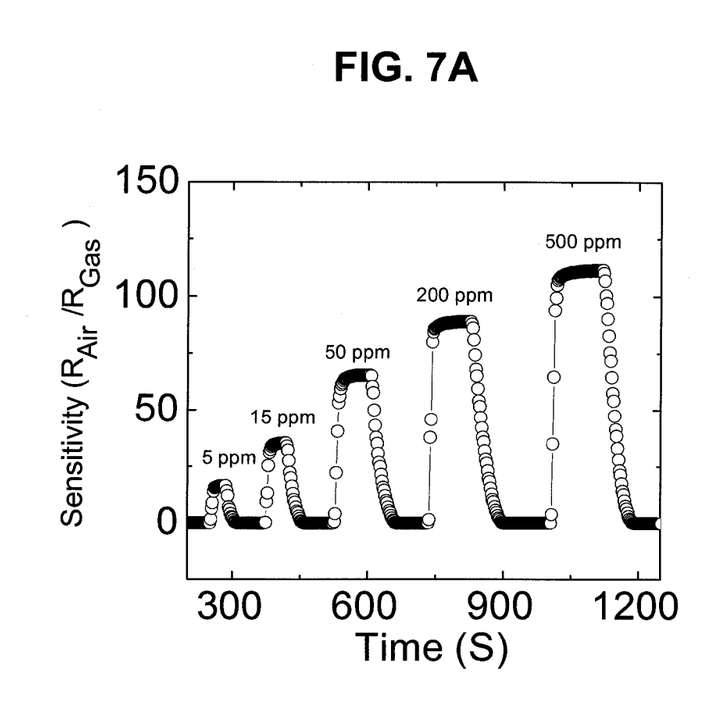
FIG. 7A is a view showing a graph of a result of measurement of a sensitivity of an ethanol gas sensor using $TiO_2$ nanotubes manufactured according to a second embodiment of the invention, of which length is 600 nm.
Figure 7B:
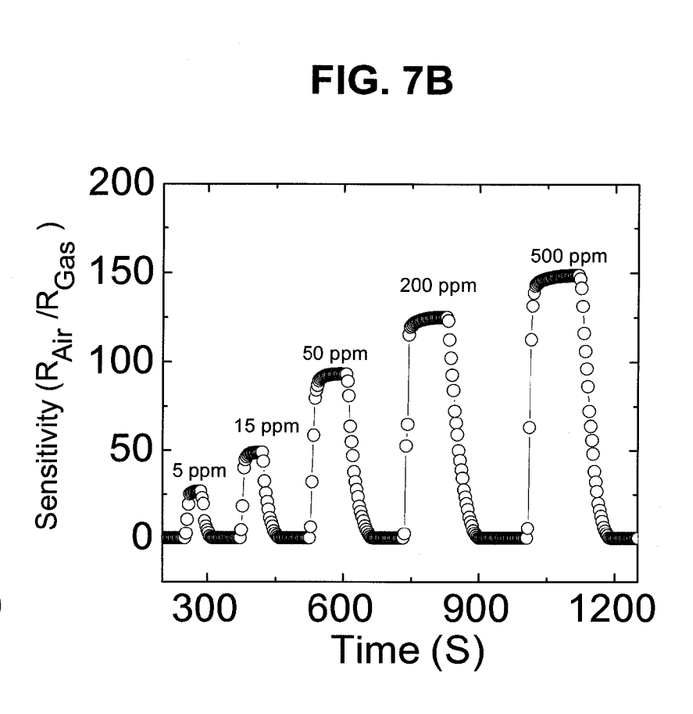
FIG. 7B is a view showing a graph of a result of measurement of a sensitivity of an ethanol gas sensor using the $TiO_2$ nanotubes manufactured according to the second embodiment of the invention, of which length is 1200 nm.

In addition, as shown in FIGS. 7A and 7B, the sensitivity of the gas sensor manufactured according to the second embodiment of the invention is 25 at the room temperature at the ethanol concentration of 5 ppm. The sensitivity is increased up to 120 as the ethanol concentration is increased (refer to FIG. 7A). In addition, the sensitivity is increased up to 160 as the length of the nanotubes is increased from 600 nm to 1,200 nm (refer to FIG. 7B).

The gas sensors manufactured according to the first and second embodiments of the invention have excellent gas detection performance, particularly, at the room temperature. In addition, the gas sensors can be manufactured at low cost by the aforementioned simple manufacturing processes. In addition, the technologies for manufacturing the gas sensors according to the invention can be immediately adapted to a field of detecting a toxic gas such as monoxide and hydrogen sulfide.

In addition, the technologies for manufacturing the aligned nanotube structure according to the invention can be adapted to medical, biological, optic, and electronic industries as well as the gas sensors.

What is claimed is:

1. A method of manufacturing a sensor structure, comprising:
   (a) forming a lower electrode on a substrate;
   (b) forming an organic template having a pore structure on the lower electrode;
   (c) forming a metal oxide thin film in the organic template;
   (d) forming a metal oxide nanotube structure on the lower electrode, in which nanotubes are vertically aligned and upper portions thereof are connected to each other, by removing the organic template through a dry etching method; and
   (e) forming an upper electrode on the upper portions of the nanotubes.

2. The method according to claim 1, wherein the forming of the organic template comprises:
   forming a polymer film;
   forming an anodic aluminum oxide mask having a pore structure on the polymer film;
   transferring the pore structure of the anodic aluminum oxide mask to the polymer film through an etching process; and
   removing the anodic aluminum oxide mask.

3. The method according to claim 1, wherein the organic template is made of polyimide.

4. The method according to claim 1, wherein the forming of the metal oxide thin film is performed by an atomic layer deposition method.

5. The method according to claim 1, wherein the removing of the organic template is performed by a thermal decomposition method.

6. The method according to claim 2, wherein the polymer film is formed by one of a spin coating method, a dip coating method, a bar coating method, and a solvent casting method.

7. The method according to claim 2, wherein the etching of the polymer film is performed by an $O_2$ reactive ion etching method.

8. A sensor element manufactured by the method according to claim 1.

9. A method of manufacturing a sensor structure, comprising:
   (a) forming an organic template having a pore structure on a substrate that can be used as an electrode;
   (b) forming a metal oxide thin film in the organic template;
   (c) forming a metal oxide nanotube structure, in which nanotubes are vertically aligned and upper portions thereof are connected to each other, by removing the organic template through a dry etching method; and
   (d) forming an upper electrode on the upper portions of the nanotubes.

10. The method according to claim 9, wherein the forming of the organic template comprises:
   forming a polymer film;
   forming an anodic aluminum oxide mask having a pore structure on the polymer film;
   transferring the pore structure of the anodic aluminum oxide mask to the polymer film through an etching process; and
   removing the anodic aluminum oxide mask.

11. The method according to claim 9, wherein the organic template is made of polyimide.

12. The method according to claim 9, wherein the forming of the metal oxide thin film is performed by an atomic layer deposition method.

13. The method according to claim 9, wherein the removing of the organic template is performed by a thermal decomposition method.

14. The method according to claim 10, wherein the polymer film is formed by one of a spin coating method, a dip coating method, a bar coating method, and a solvent casting method.

15. The method according to claim 10, wherein the etching of the polymer film is performed by an $O_2$ reactive ion etching method.

16. A sensor element manufactured by the method according to claim 9.

17. A method of manufacturing nanotubes which are vertically aligned and have upper portions connected to each other, comprising:
   (a) forming a polymer film on a substrate;
   (b) forming an anodic aluminum oxide mask having a pore structure on the polymer film;
   (c) transferring the pore structure of the anodic aluminum oxide mask to the polymer film through an etching process;
   (d) forming a polymer template by removing the anodic aluminum oxide mask;
   (e) forming a thin film in the polymer template; and
   (f) removing the polymer template by a thermal decomposition method.

18. A method of manufacturing nanotubes which are vertically aligned and which have upper portions separated from each other, comprising:
   (a) forming a polymer film on a substrate;
   (b) forming an anodic aluminum oxide mask having a pore structure on the polymer film;
   (c) transferring the pore structure of the anodic aluminum oxide mask to the polymer film through an etching process;
   (d) forming a polymer by removing the anodic aluminum oxide mask;
   (e) forming a thin film in the polymer template; and
   (f) removing the thin film formed in an upper portion of the polymer template and removing the polymer template by a thermal decomposition method.

* * * * *